United States Patent [19]
Graul et al.

[11] 3,963,524
[45] June 15, 1976

[54] METHOD OF PRODUCING A SEMICONDUCTOR DEVICE

[75] Inventors: Jüergen Graul, Gruenwald; Helmuth Murrmann, Ottobrunn, both of Germany

[73] Assignee: Siemens Aktiengesellschaft, Berlin & Munich, Germany

[22] Filed: July 9, 1975

[21] Appl. No.: 594,341

[30] Foreign Application Priority Data
July 25, 1974  Germany............................ 2435905

[52] U.S. Cl.............................. 148/1.5; 148/187; 357/91
[51] Int. Cl.²........................................ H01L 21/265
[58] Field of Search............................ 148/1.5, 187

[56] References Cited
UNITED STATES PATENTS

| | | | |
|---|---|---|---|
| 3,729,811 | 5/1973 | Beale et al. ...................... | 148/1.5 X |
| 3,730,778 | 5/1973 | Shannon et al. ...................... | 148/1.5 |
| 3,756,861 | 9/1973 | Payne et al. ...................... | 148/1.5 |
| 3,791,883 | 2/1974 | Takei et al. ...................... | 148/187 |
| 3,793,088 | 2/1974 | Eckton, Jr. ...................... | 148/1.5 |
| 3,898,105 | 8/1975 | Mai et al. ...................... | 148/1.5 |

*Primary Examiner*—L. Dewayne Rutledge
*Assistant Examiner*—J. M. Davis
*Attorney, Agent, or Firm*—Hill, Gross, Simpson, Van Santen, Steadman, Chiara & Simpson

[57] ABSTRACT

The surface of a semiconductor substrate, such as a silicon crystal, is uniformly coated with a layer of $Si_3N_4$ and at least two selectively spaced windows are provided therein. The uncovered silicon surface within such windows is then coated with a layer of $SiO_2$. Next, a $SiO_2$ area within a first window along with a portion of the adjacent $Si_3N_4$ areas are coated with a photo-lacquer mask while the substrate surface area beneath the second window is doped with a select dopant. This procedure is then reversed and the Photo-lacquer mask is removed from the first window and applied onto the second window while the substrate surface area beneath the first window is contacted with select dopant to produce a doped zone. In this manner, considerable tolerance for positioning of a diffusion mask is provided.

16 Claims, 8 Drawing Figures

METHOD OF PRODUCING A SEMICONDUCTOR DEVICE

BACKGROUND OF THE INVENTION

1. Field of the Invention

The invention relates to a method of producing multi-zone semiconductor devices and somewhat more particularly to a method of producing such semiconductor devices wherein two different protective layers are used.

2. Prior Art

German Auslegeschrift 1,589,886 (which corresponds to U.S. Pat. No. 3,791,883), suggests that semiconductor devices may be produced by coating first areas of a semiconductor surface with a $Si_3N_4$ layer and coating second areas of such semiconductor surface with $SiO_2$ layer. Windows are then provided in at least one of the two insulating layers by photo-lacquer etching techniques to uncover select areas of the semiconductor surface and different dopants are then diffused via increased temperature into, for example, a silicon surface, so as to provide a well defined pn-junction.

Frequently, in the foregoing procedure it is necessary to insure that after the production of zones of different conductivity type by a diffusion process using $SiO_2$ diffusion mask, the $SiO_2$ layer which functions simultaneously as a protective layer and as a passivation layer for the pn-junction, is protected from lateral migration of Na-ions typically present in a metal contact applied to such semiconductor devices. In order to accomplish, a $Si_3N_4$ layer is uniformly deposited on the entire surface of the semiconductor crystal and windows or openings are provided in the $Si_3N_4$ layer down to the semiconductor crystal (generally silicon) surface. These windows are typically filled with a metal contact and they are produced in such a manner that a narrow ring of silicon surface between the $SiO_2$ passivation layer and the metal contact are directly covered by the $Si_3N_4$ layer.

Frequently, with this type of procedure, it is desirable to produce two or more zones in a semiconductor device, each of which exhibits different conductivity type and are of a select size and geometry on the surface of, for example, a silicon crystal. This applies, for example, to the production of an emitter zone and a base contact zone in register with a base zone during the manufacture of planar transistors. However, when doping by the so-called ion implantation technique (where ions of select dopant atoms are, as it were, "shot" into the silicon crystal and any crystal faults or the like caused thereby are eliminated or healed by subsequent heat tempering), it is also advantageous to combine a $Si_3N_4$ layer and a $SiO_2$ layer on the surface of a silicon crystal in the manner suggested by the aforesaid prior art patent. It is then possible to produce level or plane doping fronts or profiles as will be explained in detail hereinafter.

SUMMARY OF THE INVENTION

In accordance with the principles of the invention, a mask of $Si_3N_4$ having at least two windows arranged next to one another with a select space therebetween is positioned on the surface of a silicon crystal and the silicon surface accessible through such windows is oxidized in such a way that neither the $Si_3N_4$ layer nor the silicon surface covered by such layer is oxidized. Thereafter, two doping processes which are performed under different conditions (diffusion and/or implantation) are undertaken; the $SiO_2$ layer on one of the windows is removed for one of such doping procedures and the $SiO_2$ layer on the other window is removed for the other of such doping processes while in each case, the other of the two windows is blocked against the dopant.

In accordance with the principles of the invention, after the production of a $Si_3N_4$ layer which covers a first sub-zone of a semiconductor substrate in the desired geometric form, the surface of a second sub-zone on such substrate is oxidized to form a $SiO_2$ layer in such a manner that the layer of $Si_3N_4$ which is directly adjacent to such second sub-zone is retained and a part of the $SiO_2$ layer and at least a part of the $Si_3N_4$ layer are then covered with a photo-lacquer mask for the localized doping of that zone on the surface of the semiconductor substrate, for example, a silicon monocrystal, which is covered at least by a part of the $SiO_2$ layer.

In one embodiment of the invention, the photo-lacquer mask functions as an etching mask for removal of the $SiO_2$ layer at select places from the semiconductor substrate surface so that a diffusion or implantation mask is formed which determines the geometry of the pn- or other junctions to be produced between the zones of different conductivity. The geometry of the $Si_3N_4$ mask governs the shape of the respective junctions.

In another embodiment of the invention, the photo-lacquer mask functions to exclusively determine the doping geometry to be established by ion implantation.

DESCRIPTION OF THE PREFERRED EMBODIMENTS

Figure 1:
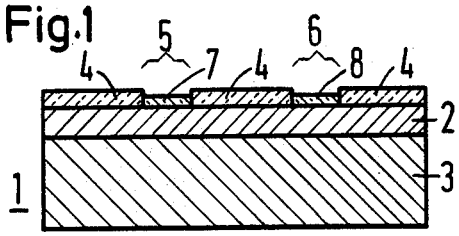
FIGS. 1–3 are schematic elevated views of a semiconductor device undergoing sequential processing steps in accordance with an embodiment of the invention.

In the drawings and following description, the invention is described in relation to the production of silicon planar transistors and silicon mesa transistors, however, other types of semiconductor devices may also be produced by following the principles of the invention.

A monocrystalline substrate or wafer 1, typically composed of silicon, of a given conductivity type, is provided with a surface zone 2 of another conductivity type, either by diffusion, epitaxy or ion-implantation. This surface zone 2 functions as a base zone of the transistor being produced while the remainder of the wafer 1 functions as a collector zone 3 and is later provided with an appropriate collector electrode in a known manner, for example, by metal vapor deposition.

After the production of surface zone 2, which may be produced, for example, by epitaxy, by diffusion or by implantation, i.e. via a diffusion mask, the free surface of zone 2 is cleansed or freed of any foreign layers, at least in the regions where additional doping is to be produced. If a diffusion mask and a protective layer have been used in the production of the surface or base zone 2, they may remain on the surface of the collector-base pn-junction.

In accordance with the invention, a $Si_3N_4$ layer 4 is then deposited onto the cleansed surface of zone 2 and provided with at least two windows 5 and 6 which penetrate through the layer 4 to the surface of zone 2. Windows may be produced with the aid of known photo-lacquer etching techniques, for example, using hot orthophosphoric acid as an etching agent. The resultant arrangement is then thermally or anodically oxidized in such a manner that the $Si_3N_4$ layer 4 is not attacked to produced $SiO_2$ layers 7 and 8 respectively onto the silicon surface accessible through the windows 5 and 6. The thickness of the $Si_3N_4$ layer 4 and that of the oxide layers 7 and 8 are controlled so as to be suitable for blocking or withholding a gas phase dopant from penetrating into the covered silicon substrate. A structure processed in accordance with the foregoing steps is illustrated at FIG. 1.

Typically, the $Si_3N_4$ layer 4 has a thickness of about 1000 to 2000 AE and the $SiO_2$ layers have a thickness of about 1000 to 4000 AE. In order to produce the $Si_3N_4$ layer, the structure to be coated is typically heated in a suitable reaction gas (for example, a mixture of $SiH_3$, $NH_3$ and argon) at temperatures of at least about 700° to 800° C. It is advantageous to form the $Si_3N_4$ layer in a thickness sufficient to be resistant to at least buffered hydrofluoric acid. Any etching of such a $Si_3N_4$ layer must be carried out with hot phosphoric acid.

Figure 2:
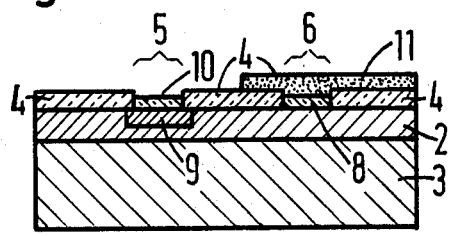
Figure 3:
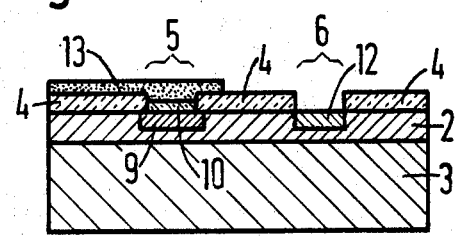

In proceeding along with the further steps of the invention, as shown in FIGS. 2 and 3, an important advantage is realized in that relatively inaccurate photo-lacquer masks may be used for producing precise conductivity zones in the substrate 1.

For example, in the production of a contact zone 9, which preferably is of the same conductivity type as zone 2, the $SiO_2$ layer 8 and adjacent $Si_3N_4$ layer areas are coated with a photo-lacquer mask 11 and the $SiO_2$ layer 7 is then etched down to the substrate surface below window 5. Typically, this may be accomplished by using dilute or buffered hydrofluoric acid (which does not materially attack the $Si_3N_4$ layer). Thus, the mask 11 can be relatively imprecise and does not require a geometry precisely matching that of windows 5 or 6.

After removal of the $SiO_2$ layer 7, the contact zone 9 is expediently produced via conventional diffusion techniques, during which the $Si_3N_4$ layer 4 and the $SiO_2$ layer 8 remain on the substrate and function as diffusion masks preventing the dopant from penetrating into the substrate areas beneath such layers.

In a preferred embodiment, the above diffusion process is carried out under oxidation conditions so that a new $SiO_2$ layer 10 forms during the diffusion process on the substrate (silicon) surface beneath window 5. The resultant structure is schematically illustrated at FIG. 2.

The foregoing window masking procedure is then reversed so that the $SiO_2$ layer 10 in window 5 and adjacent $Si_3N_4$ layer areas are covered with a photo-lacquer mask 13 and the mask 11 is removed with a suitable developer therefor (typically the masks 11 and 13 are formed of different photo-lacquers, each of which has a developer or solvent therefor which does not attack the other material). Thereafter, the $SiO_2$ layer 8 is etched down to the substrate surface in the same manner as described in relation to layer 7. The unchanged $Si_3N_4$ layer 4 and the $SiO_2$ layer 10 in window 5 are then used as diffusion masks so that an appropriate dopant is diffused only into the uncovered substrate area beneath window 6 to produce a zone 12 of a given conductivity type.

In order to complete the transistor device, such as shown at FIG. 3, the mask 13 is removed via a suitable solvent and, if desired, contact points for zones 3, 9 and 12 are uncovered and provided with a collector electrode, a base electrode and an emitter electrode in a conventional manner. These electrodes have been omitted from the drawings.

Conventional ion implantation techniques may be used for doping zones 9 and 12. This typically involves producing ions of a dopant providing the desired conductivity type to a zone, accelerating such ions by an electrical field so as to produce an ion beam and guiding the ion beam or accelerated ions toward the surface of a semiconductor substrate which is to be doped. Known techniques, for example, for the production of a channel beam may be utilized for ion implantation. In this embodiment, the $Si_3N_4$ layer must be of a thickness sufficient to resist penetration by the accelerated ions and this may be readily achieved by an appropriate matching of the $Si_3N_4$ layer thickness with the energy of the accelerated ions, i.e. with the electric voltage applied to the ions. As during the doping process explained earlier, the $SiO_2$ layer in either windows 5 or 6 is etched away and it must be insured that either the $SiO_2$ layer is present on the other window and/or the photo-lacquer mask, such as mask 11 or 13 protects the substrate surface beneath the $SiO_2$ coated area from the accelerated ions. The absorption capability of an approximately 1 $\mu$m thick layer composed of typical photo-lacquer materials is adequate to provide the desired protection against accelerated ions.

The geometry of zones 9 and 12 produced within a substrate 1 are thus obviously decisively determined by the geometry of windows 5 and 6 in the $Si_3N_4$ layer 4. Such windows are easily, precisely and reproducibly produced with a single photo-lacquer mask so as to be of a given size and spaced apart a select distance. A suitable etchant for the $Si_3N_4$ layer may, for example, be comprised of strong or concentrated hydrofluoric acid or hot phosphoric acid and in certain instances, it may be advisable to render the photo-lacquer masks resistant to such aggressive etchants, as by subjecting the masks to a tempering or heating process involving temperatures of a few 100°.

As may be apparent, the process sequentially illustrated at FIGS. 1–3 may be modified so that zones 9 and 12 are suitably doped to form a collector and an emitter zone respectively of a transistor. The zone 3 may then, for example, be used as a collector or be given another function. It will also be apparent that other semiconductor devices, for example, the so-called lateral transistors or integrated circuits, may also be produced by following the principles of this embodiment of the invention.

During ion implantation doping, the ions which impinge on the substrate (silicon) surface may be provided with a sufficient kinetic energy to easily penetrate a layer of a foreign material, such as $SiO_2$ or $Si_3N_4$ on the impinged substrate surface and to dope the so-covered substrate surface. Accordingly, the principles of the invention may be utilized to simultaneously dope by ion implantation a select first surface area and an adjacent second surface area of a silicon crystal, each of which are respectively covered with a $Si_3N_4$ layer and/or a $SiO_2$ layer. Portions of such first and second areas which are not to be so-doped may be readily protected by a photo-lacquer mask of sufficient thickness (for example, 1 to 2 μm) which will safely block the oncoming ion beam.

Accordingly, in a second embodiment of the invention, after the production of a $Si_3N_4$ layer on a first surface area or sub-zone of a substrate (i.e. a silicon crystal) and after the production of a $SiO_2$ layer on a second sub-zone of the substrate surface, a photo-lacquer layer or mask is provided having windows therein which provide access to both a part of the $Si_3N_4$ layer and an adjacent part of the $SiO_2$ layer. The surface of the resultant structure or arrangement is then subjected to a select dopant ion beam so that a part of the insulating layers are accessible through the mask windows to the oncoming ions but other parts of the insulating layer underlying the mask are protected from the ion penetration and only the substrate surface areas underlying such accessible areas (which are covered by an insulating layer) are doped by the penetrating ions.

During a typical ion implantation process, the surface of a semiconductor substrate, for example, a silicon monocrystal, is coated with protective layers of different thickness and different properties. This allows the semiconductor surface to be doped in stages and becomes manifest by different dopant penetration depths or dopant fronts. However, if, for example, a silicon surface to be doped by ion implantation is caused to adjoin in part a $SiO_2$ and in part a $Si_3N_4$ layer so that such layers are not superimposed on one another, one can readily achieve by appropriate matching or layer thickness of the two insulating materials, flat implantation fronts. Further, due to the different chemical properties of such insulating materials, one may also use to advantage (as already explained in conjunction with the first embodiment of the invention), such different chemical properties to determine geometric shapes of other conductivity zones within the semiconductor device having a flat implantation front. This embodiment of the invention will be described in further detail hereinafter in conjunction with FIGS. 4 –8 relative to the production of a transistor having an emitter and a base zone produced by ion implantation.

A n-conductive monocrystalline silicon layer 15 is epitaxially deposited on the surface of a $n^+$-conductive silicon substrate 14. Using a photo-lacquer etching technique, a network of grooves or trenches (diagrammatically indicated at 17a) are etched into the epitaxial layer 15 and the surface of the epitaxial layer 15 is covered with a $Si_3N_4$ layer 16. In this manner, insular projections or ridges 17 composed of $SiO_2$ are formed between the individually adjacent grooves. FIGS. 4–8 each illustrate only one such island $S_I$, however, the production process of the invention is suitable for simultaneously processing a number of such islands on a silicon wafer, similar to that used in the known planar technique.

After the etching of the grooves 17a, which divide up not only the expitaxial layer 15 but also the insulating $Si_3N_4$ layer 16 which is uniformly applied onto layer 15, into a plurality of completely isolated insular islands $S_I$, the uncovered Si surface areas within the grooves are oxidized. During this oxidiation process, care is taken to insure that neither the remaining parts of the $Si_3N_4$ layer 16 nor the portion of the Si surface covered by the $Si_3N_4$ are noticeably oxidized. However, the so-formed $SiO_2$ layers or ridges 17 within the grooves 17a (which protect the flanks of each individual island $S_I$ on the silicon body) are formed relatively thick (i.e. about 1.0 to 2.5 μm). This type of oxidation may be achieved, for example, by using oxidizing conditions comprised of a temperature of about 950° C. and a moist $O_2$ atmosphere and by applying the $Si_3N_4$ layer 16 in a thickness of about 0.1 μm.

Figure 4:
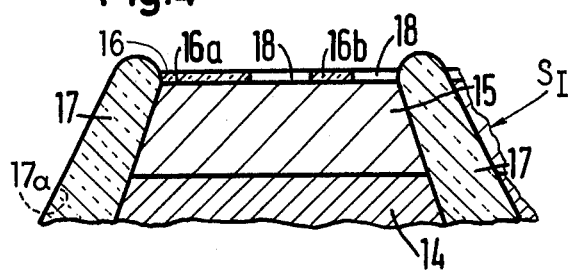
FIGS. 4–8 are somewhat similar schematic views of a portion of a semiconductor device undergoing sequential processing steps in accordance with another embodiment of the invention.

Using a photo-lacquer etch mask, one then removes individual layer areas of the $Si_3N_4$ layer 16 at all areas thereof where the underlying silicon surface areas are not to be converted into an emitter zone and, in the present example, not to be converted into a base zone contact. This results in an arrangement such as shown at FIG. 4 where each silicon island $S_I$, is provided with a plurality of $Si_3N_4$ sub-islands or sub-layer areas 16a and 16b (achieved by dividing up the uniform layer 16). Area 16a corresponds to the location where a base contact zone is to be subsequently produced by doping and area 16b corresponds to the location of an emitter zone to be subsequently produced. Thus, each of the so-formed $Si_3N_4$ sub-islands 16a and 16b are surrounded by zones 18, the surface of which comprises a free silicon surface. Each of the individual silicon islands $S_I$ are separate from other islands by the relatively thick $SiO_2$ ridges 17 and each such island has a plurality of sub-islands of $Si_3N_4$ and Si thereon. This step of sub-dividing the surface of each individual island into a plurality of sub-islands also determines the length and width of the emitter to be produced (i.e. equal to the length and width of the $Si_3N_4$ sub-island 16b) as well as the distance between the emitter and the base contact (equal to the width of zones 18). FIG. 4 generally illustrates an island $S_I$ of a device which has been subjected to the foregoing sequential steps.

Figure 5:
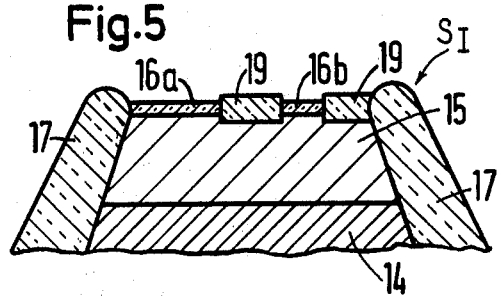

In a following oxidation process, the results of which are shown at FIG. 5, one proceeds in accordance with the invention and covers the zones 18 with a $SiO_2$ layer 19. The layer 19 fuses with the adjacent boundaries of the pre-existing $SiO_2$ ridges 17.

Figure 6:
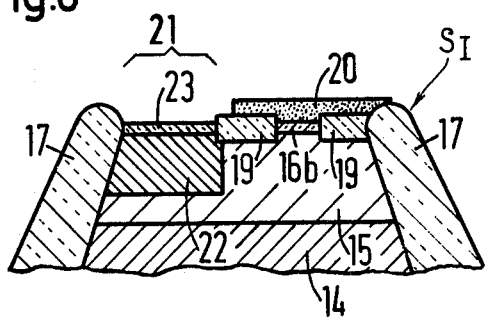
Figure 7:
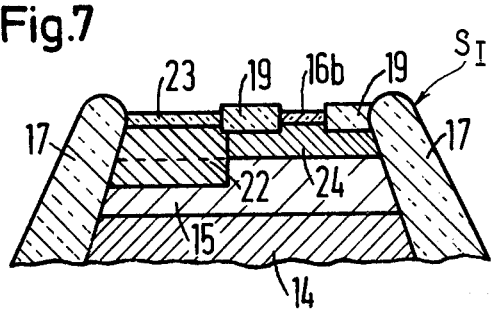
Figure 8:
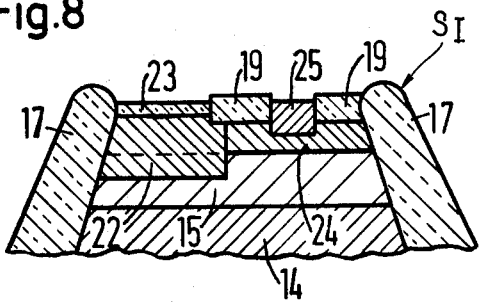

The thickness of the $SiO_2$ layer 19 is matched to the thickness of the $Si_3N_4$ sub-islands 16a and 16b (i.e. to the remnants of the $Si_3N_4$ layer 16) in such a manner that at least during the production of a base zone 24 by ion implantation (which base zone is located between a base contact zone 22 and an $SiO_2$ ridge 17 shown at FIGS. 6–8 on the right hand side of the illustrated semiconductor island, i.e. the zone beneath the emitter of the transistor being manufactured), the incoming ions, on the average, lose about the same amount of energy in sub-islands 16a, 16b and 19. In this manner, it is possible to insure that the ions penetrating into the silicon surface covered by the different insulating materials have approximately the same kinetic energy and thus penetrate to a substantially uniform depth into the silicon substrate. During this step, one must also take into account the fact that the $SiO_2$ sub-islands 19, which have been produced thermally or by anodic oxidation, in contrast to the $Si_3N_4$ sub-islands 16a and 16b which have been deposited from a gas phase, grow somewhat into the original surface of the silicon substrate (for example, as schematically illustrated at FIG. 5).

Taking the foregoing parameters into account, it has been discovered that the layer thickness of a thermally or anodically produced $SiO_2$ sub-island 19 must be about double that of the $Si_3N_4$ sub-islands 16a and 16b so that only the zone of practical interest which lies beneath the $SiO_2$ sub-islands 19 and beneath the $Si_3N_4$ sub-islands 16a and 16b is penetrated to a substantially uniform depth by the incoming ions. Such a base zone provides a stepless, flat, collector-base pn-junction, if one employs a light implantation process to introduce suitable dopant ions (i.e. for the production of p-zones, one uses boron ions, singularly charged and for the production of n-zones, one uses phosphorus or arsenic ions, singularly charged).

After the production of the $SiO_2$ sub-islands 19, the production of a base zone 22 commences. First, the $Si_3N_4$ sub-island 16a is selectively removed while the $Si_3N_4$ sub-island 16b and adjacent areas of $SiO_2$ sub-islands 19 are covered with a photo-lacquer mask 20. Again, considerable tolerance in the positioning of mask 20 is permissible so that placement thereof is economical. In order to remove the sub-island 16a, an etchant which attacks only $Si_3N_4$ and not $SiO_2$ is used, for example, hot phosphoric acid. Of course, the mask 20 must be formed of a photo-lacquer material which is at least resistant to, for example, hot phosphoric acid so that when such an arrangement, such as shown at FIG. 6, is treated with hot phosphoric acid, only the silicon surface in window 21 is uncovered without attacking the unmasked portions of the $SiO_2$ sub-island 19. Next, a highly $p^+$ doped zone 22 (which forms the contact point of a base zone yet to be produced) is formed by known techniques. Thereafter, or concurrently therewith, the uncovered silicon layer is again oxidized so as to form a new $SiO_2$ layer 23 within the window 21 and the mask 20 is then removed via a suitable solvent therefor.

Now a base zone 24 is produced by subjecting the resultant arrangement to an ion implantation process with boron without removing the other insulating layers covering the silicon surface. Thus, implantation is perfected through the $SiO_2$ layers or sub-islands 23 and 19 and through the $Si_3N_4$ sub-island 16b. The energy of the boron ion beam used for this purpose is regulated or controlled so that the boron ions do not penetrate the relatively thick $SiO_2$ ridges 17 which protect the flanks of each silicon island $S_I$ but easily penetrate the substantially thinner sub-islands 16b, 19 and 23. Since the $SiO_2$ sub-islands 19 are approximately twice as thick as the $Si_3N_4$ sub-island 16b (no such thickness matching is required between sub-islands 23 and 19) the so-formed base zone 24 will, in fact, adjoin the collector formed by the residue of the n-conductive epitaxial layer 15 in each individual silicon island $S_I$. An island $S_I$ so-processed as illustrated at FIG. 7.

Next, an emitter zone 25 is formed by implantation of arsenic or phosphorus ions. First, the $Si_3N_4$ sub-island 16b is removed from the surface of each silicon island $S_I$, such as by hot $H_3PO_4$ so that it is possible to dispense with a mask. The resultant structure is then subjected to an ion beam, for example, of arsenic or phosphorus ions, having a controlled or regulated energy so that the beams thereof cannot penetrate the $SiO_2$ areas, i.e. areas 17, 19 and 23, and only are capable of penetrating the silicon surface areas uncovered by the removal of the sub-island 16b and thereby only dope a strictly limited region corresponding to the emitter zone 25 (such as shown at FIG. 8).

In instances where the thickness of the $SiO_2$ areas 17, 19 and 23 is at least 0.1 μm, the energy of the ions impinging thereagainst is regulated to be about 40 keV whereas an implantation energy of about 80 to 200 keV is used to produce the base zone 24 and uniformly penetrates the approximately 0.2 μm thick $SiO_2$ sub-islands 19 and the approximately 0.1 μm thick $Si_3N_4$ sub-island 16b without simultaneously penetrating the approximately 1.5 μm thick $SiO_2$ ridges 17.

As is apparent, the foregoing doping conditions of the individual zones of a transistor may be reversed without making any fundamental changes in a desired process. Each of the silicon islands $S_I$ processed in accordance with the principles of the invention are now provided with an emitter and a base electrode in a conventional manner, after providing access to the base contact zone 22, as by at least partially removing the $SiO_2$ layer or sub-island 23 and after tempering the resultant structure to eliminate or heal any crystal defects (i.e. heating for about 30 minutes at a temperature of about 950°C.).

Finally, the individual islands $S_I$ are completed by providing a contact for zone 14 of the individual islands so as to form a functional transistor.

The foregoing is considered as illustrative only of the principles of the invention. Further, since numerous modifications and changes would readily occur to those skilled in the art, it is not desired to limit the invention to the exact construction, arrangement and operation as shown and described and accordingly, all suitable modifications and equivalents may be resorted to, falling within the scope of the invention as claimed.

We claim as our invention:

1. In a process for the production of a semiconductor device wherein a first sub-zone of a silicon substrate is covered with a protective layer of silicon nitride, a second sub-zone of the silicon substrate which is adjacent to said first sub-zone is covered with a protective layer of silicon dioxide, and the silicon substrate surface is subjected to a localized doping process in the presence of the silicon nitride layer so that the dopant junctions thus formed in the silicon substrate reaches the substrate surface at least at points within the first sub-zone; the improvement comprising in that:

after the coating of the silicon nitride layer onto said first sub-zone in its final form, the surface of said second sub-zone is oxidized to form silicon dioxide in such a manner that at least said layer of silicon nitride which is directly adjacent to the silicon substrate surface is retained;

that a select part of said silicon dioxide layer and at least an adjacent part of said siicon nitride layer are then covered with a photo-lacquer mask having at least one window therein leaving at least another part of said silicon dioxide layer uncovered; and subjecting the resultant structure to localized doping whereby the zone of the silicon substrate covered at least by said other part of the silicon dioxide layer is doped.

2. In a process as defined in claim 1 including:

uniformly applying a silicon nitride layer onto a surface of the silicon substrate, said silicon nitride layer having at least two windows therein spaced a select distance from one another;

oxidizing the accessible silicon surface within said windows of the silicon nitride layer so as to form a layer of silicon dioxide on such accessible surfaces under such oxidizing conditions which insure that portions of the silicon nitride layer adjacent the silicon surface and portions of the silicon surface covered by said silicon nitride layer remain unoxidized;

applying a first photo-lacquer etch mask having an opening therein corresponding to only a first of said two windows in the silicon nitride layer onto the resultant structure so that said opening and said first window are in registry, removing the silicon dioxide layer beneath such opening so as to uncover the underlying silicon surface and subjecting such uncovered silicon surface area to a first doping procedure;

removing said first photo-lacquer etch mask from the resultant structure and applying a second photo-lacquer etch mask having an opening therein corresponding to only a second of said two windows in the silicon nitride layer onto the resultant structure so that said opening and said second window are in registry, removing the silicon dioxide layer beneath such opening so as to uncover the underlying silicon surface and subjecting such uncovered silicon surface area to a second doping procedure, said first and second doping procedures being different from one another.

3. In a process as defined in claim 2 wherein said first and second photo-lacquer masks have an opening which leaves uncovered only a silicon dioxide layer in a window and at least a part of the silicon nitride layer adjacent such silicon dioxide layer and that the resultant unprotected silicon dioxide layer is removed via an etchant which is substantially inert relative to the photo-lacquer mask and the silicon nitride layer.

4. In a process as defined in claim 3 wherein said etchant comprises buffered hydrofluoric acid.

5. In a process as defined in claim 2 wherein a base zone adapted to form a collector of a transistor is produced in the silicon substrate before application of the silicon nitride layer and then the other steps of claim 2 are undertaken whereby an emitter zone is produced in said substrate by said first doping procedure and a base contact zone is produced in said substrate by said second doping procedure.

6. In a process as defined in claim 2 wherein a base zone of a transistor is produced in the silicon substrate before application of the silicon nitride layer and then the other steps of claim 2 are undertaken whereby a collector zone is produced in said substrate by said first doping procedure and an emitter zone is produced in said substrate by said second doping procedure.

7. In a process as defined in claim 2 wherein said first and second doping procedures include diffusing-in a dopant in select interference patterns for which the silicon nitride layer and the silicon dioxide layer protected by the photo-lacquer mask function as diffusion masks.

8. In a process as defined in claim 6 wherein said first and second doping procedures include injecting dopant ions under conditions which prevent such ions from passing through the silicon nitride layer and the silicon dioxide layer protected by the photo-lacquer masks.

9. In a process as defined in claim 1 wherein after the production of the silicon nitride layer on the first sub-zone of the silicon substrate and after the production of the silicon dioxide layer on the second sub-zone of the silicon substrate, covering the layers of silicon nitride and silicon dioxide with a photo-lacquer layer and producing windows in such photo-lacquer layer which uncover adjoining areas of the silicon nitride and silicon dioxide layers; and subjecting the resultant structure to ions of a dopant whereby said ions penetrate through the uncovered areas of the silicon nitride and silicon dioxide layers to dope the underlying silicon surface areas and are blocked by the photo-lacquer layer so that the silicon surface areas underlying such photo-lacquer layer remain free of dopant ions.

10. In a process as defined in claim 1 wherein after the production of the silicon nitride layer on the first sub-zone of the silicon substrate.

applying the silicon dioxide layer onto the second sub-zones of the silicon substrate in a thickness which is about double that of the silicon nitride layer; and doping the substrate surface beneath both the first and second sub-zones by ion implantation and without removing said silicon nitride and silicon dioxide layers, said ion implantation including regulating the average kinetic energy of the ions used in implantation so that a stepless flat doping profile is formed beneath said silicon nitride and silicon dioxide layers.

11. In a process as defined in claim 10 wherein a transistor is being produced and a portion of the silicon substrate is doped to form a collector zone, said first and second sub-zones are selected to correspond to the location of a base zone in said transistor and are respectively covered with a layer of silicon nitride and silicon dioxide, said layer of silicon dioxide having a thickness about double the thickness of said silicon nitride layer.

12. In a process as defined in claim 11 wherein said first sub-zone is comprised of at least two completely separate parts, the first of such parts being used to produce a base contact zone and a second of such parts being used to produce an emitter zone.

13. In a process as defined in claim 11 wherein after the production of a silicon nitride layer on each of said separate parts of the first sub-zone so as to form separate sub-layers of silicon nitride on each such part, and after the production of the silicon dioxide layer which separate such separate parts and covers the second sub-zone;

removing a first sub-layer of silicon nitride from the silicon substrate and subjecting the underlying substrate surface area to doping conditions to form the base contact zone using the second sub-layer of silicon nitride, the layer of silicon dioxide layer adjacent thereto and a silicon dioxide layer on the remainder of the substrate surface as a diffusion mask; and then ion-implanting a base zone through said second sub-layer of silicon nitride and the layer of silicon oxide layer adjacent thereto while using the silicon oxide layer on the remainder of the substrate surface as a diffusion mask.

14. In a process as defined in claim 13 wherein said second sub-layer of silicon nitride is removed from the silicon substrate surface so as to uncover an underlying silicon surface area, and subjecting such uncovered silicon surface area to a beam of select dopant ions, said beam imparting an energy to ions therein sufficient only to penetrate such silicon surface and to be blocked by the silicon dioxide layers which cover the remainder of the substrate surface.

15. In a process as defined in claim 13 wherein after the production of said base contact zone the silicon surface uncovered by removal of said first sub-layer of silicon nitride is re-covered with a layer of silicon dioxide.

16. In a process as defined in claim 13 wherein during the production of said base contact zone the silicon surface uncovered by removal of said first sub-layer of silicon nitride is re-covered with a layer of silicon dioxide.

* * * * *